United States Patent
Song et al.

(10) Patent No.: US 8,236,224 B2
(45) Date of Patent: *Aug. 7, 2012

(54) APPARATUS AND METHOD OF FABRICATING FLAT PLATE DISPLAY

(75) Inventors: Tae-Joon Song, Paju-si (KR); Jin-Wuk Kim, Goyang-si (KR); Seong-Pil Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/911,520

(22) Filed: Oct. 25, 2010

(65) Prior Publication Data

US 2011/0147988 A1    Jun. 23, 2011

(30) Foreign Application Priority Data

Dec. 18, 2009  (KR) .................. 10-2009-0127030

(51) Int. Cl.
*B29C 59/00* (2006.01)
(52) U.S. Cl. ................. 264/293; 425/385; 425/436 RM
(58) Field of Classification Search .................. 264/293, 264/319, 299, 334; 425/385, 436 R, 174.4, 425/441, 436 RM, 185, 186
See application file for complete search history.

(56) References Cited

U.S. PATENT DOCUMENTS

| | | | |
|---|---|---|---|
| 2004/0219249 A1* | 11/2004 | Chung et al. | 425/385 |
| 2006/0290026 A1* | 12/2006 | Chae et al. | 264/219 |
| 2007/0284777 A1* | 12/2007 | Kim et al. | 264/225 |
| 2008/0227244 A1* | 9/2008 | Kim | 438/160 |
| 2009/0026658 A1* | 1/2009 | Hosoda et al. | 264/319 |
| 2009/0139960 A1* | 6/2009 | Kim et al. | 216/24 |
| 2009/0283937 A1* | 11/2009 | Kodama et al. | 264/447 |
| 2010/0062098 A1* | 3/2010 | Ando et al. | 425/385 |
| 2010/0166906 A1* | 7/2010 | Hashimoto et al. | 425/385 |

* cited by examiner

*Primary Examiner* — Yogendra Gupta
*Assistant Examiner* — Ninh Le
(74) *Attorney, Agent, or Firm* — McKenna Long & Aldridge, LLP

(57) ABSTRACT

A fabricating apparatus and a method of a flat plate display are disclosed. A fabricating apparatus of a flat plate display includes a stage on which a substrate is seated, an imprinting mold bonded with the substrate to form a thin film pattern on the substrate, the imprinting mold comprises projections and grooves, a supporter configured to support the imprinting mold, and a horizontal compensating part configured to compensate downward-bending of the imprinting mold by pressing the imprinting mold.

5 Claims, 8 Drawing Sheets

APPARATUS AND METHOD OF FABRICATING FLAT PLATE DISPLAY

CROSS REFERENCE TO RELATED APPLICATION

This application claims the benefit of the Patent Korean Application No, 10-2009-0127030, filed on Dec. 18, 2009, which is hereby incorporated by reference as if fully set forth herein.

BACKGROUND OF THE DISCLOSURE

1. Field of the Disclosure

The present invention relates to a fabricating apparatus and method of a flat plate display which can reduce bending-down of an imprinting mold.

2. Discussion of the Related Art

Various kinds of flat plate displays capable of reducing a weight and volume which are disadvantages of a cathode ray tube (CRT) haven been emerging recently. Such a flat plate display includes a liquid crystal display (LCD), a field emission display, a plasma display panel and an electro-luminescence (EL) display.

This flat plate display is configured of a plurality of thin films formed by a mask process including depositing (coating), exposing, developing and etching. However, the mask process has complicated fabricating assembly process and it has a disadvantage of high production cost. As a result, research and study haven been under progress to form thin films via a patterning process using an imprinting mold in recent.

According to this patterning process, when a liquid polymeric precursor contacts with a imprinting mold which has a groove and a projection after liquid resin is painted on a substrate, the groove and the projection of the imprinting mold are reverse-transferred to the liquid polymeric precursor and the reverse-transferred liquid polymeric precursor is hardened in a hardening process to form a desired thin film pattern on the substrate.

Figure 1:
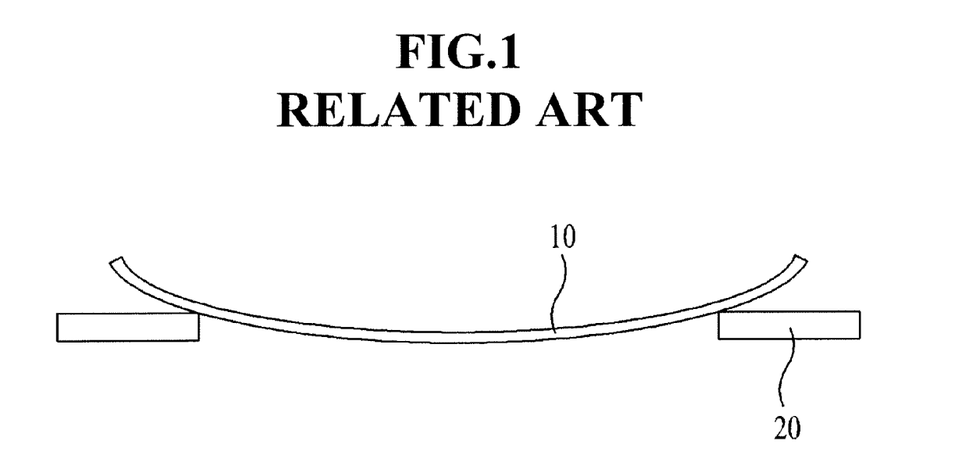
FIG. 1 is a sectional view illustrating a related art imprinting mold.

Here, a related art imprinting mold 10 is supported by supporters 20 as shown in FIG. 1. However, the supporters 20 support only edges of the imprinting mold. Because of that, a back plate of the imprinting mold would bend downward only to come down by 1 mm or less.

In this case, when separating the imprinting mold and the substrate from each other, the bending back plane of the imprinting mold might be straightened and this would generate elasticity damaging to the imprinting mold 10 disadvantageously. In addition, if the bending degree of the imprinting mold 10 is large, the imprinting mold 10 and the substrate has to maintain a gap larger than the bending-down when the imprinting mold 10 and the substrate are aligned. Because of that, a vertical motion width of a stage having the substrate seated thereon will be getting large after the alignment process until a bonding process between the imprinting mold and the substrate and an error will be getting large accordingly.

Furthermore, the bending imprinting mold 10 is straightened as bonded with the substrate, after the imprinting mold 10 in a state of bending and the substrate are aligned. Because of that, an error of alignment accuracy might be generated.

SUMMARY OF THE DISCLOSURE

Accordingly, the present invention is directed to a fabricating apparatus and method of a flat plate display An object of the present invention is to provide a fabricating apparatus of a flat plate display which is able to reduce bending-down of an imprinting mold.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a fabricating apparatus of a flat plate display includes a stage on which a substrate is seated; an imprinting mold bonded with the substrate to form a thin film pattern on the substrate, the imprinting mold comprises projections and grooves; a supporter configured to support the imprinting mold; and a horizontal compensating part configured to compensate downward-bending of the imprinting mold by pressing the imprinting mold.

The size of the imprinting mold may be larger than the size of the substrate and the supporter and the horizontal compensating part may be installed an edge of the imprinting mold which is not overlapped with the substrate.

The horizontal compensating part may be not in contact with the imprinting mold when the imprinting mold and the substrate are bonded with each other and the horizontal compensating part may be in contact with the imprinting mold when the imprinting mold and the substrate are separated from each other.

The fabricating apparatus may further include a supporting frame configured to support the horizontal compensating part and the supporter, wherein the horizontal compensating part moves upward and downward along a moving passage of the supporting frame.

The horizontal compensating part may be formed of Sus or Aluminum based material.

In another aspect of the present invention, a fabricating method of a flat plate display includes steps of: seating a substrate having liquid polymeric precursor formed thereon on a stage; bonding an imprinting mold and the substrate with each other by moving the stage upward, for grooves and projections of the imprinting mold to press the liquid polymeric precursor; and separating the imprinting mold and the substrate from each other by allowing a supporter to support the imprinting mold and allowing a horizontal compensating part to press the imprinting mold in an opposite direction with respect to the supporter simultaneously with moving the stage downward.

The horizontal compensating part may move in opposite direction with respect to the imprinting mold along a moving passage of a supporting frame configured to support the horizontal compensating part when the imprinting mold and the substrate are bonded with each other, and the horizontal compensating part may move in direction with respect to the imprinting mold along the moving passage of the supporting frame when the imprinting mold and the substrate are separated from each other.

The present invention may have following advantages.

The fabricating apparatus and method of the flat plate display may reduce bending-down of the imprinting mold by using the horizontal compensating part capable of compensating the load of the imprinting mold. Moreover, the fabricating apparatus and method may fix the imprinting mold without bending-down of the imprinting mold, when the imprinting mold and the substrate are separated from each other. As a result, damage to the imprinting mold and the thin film pattern may be prevented.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 2:
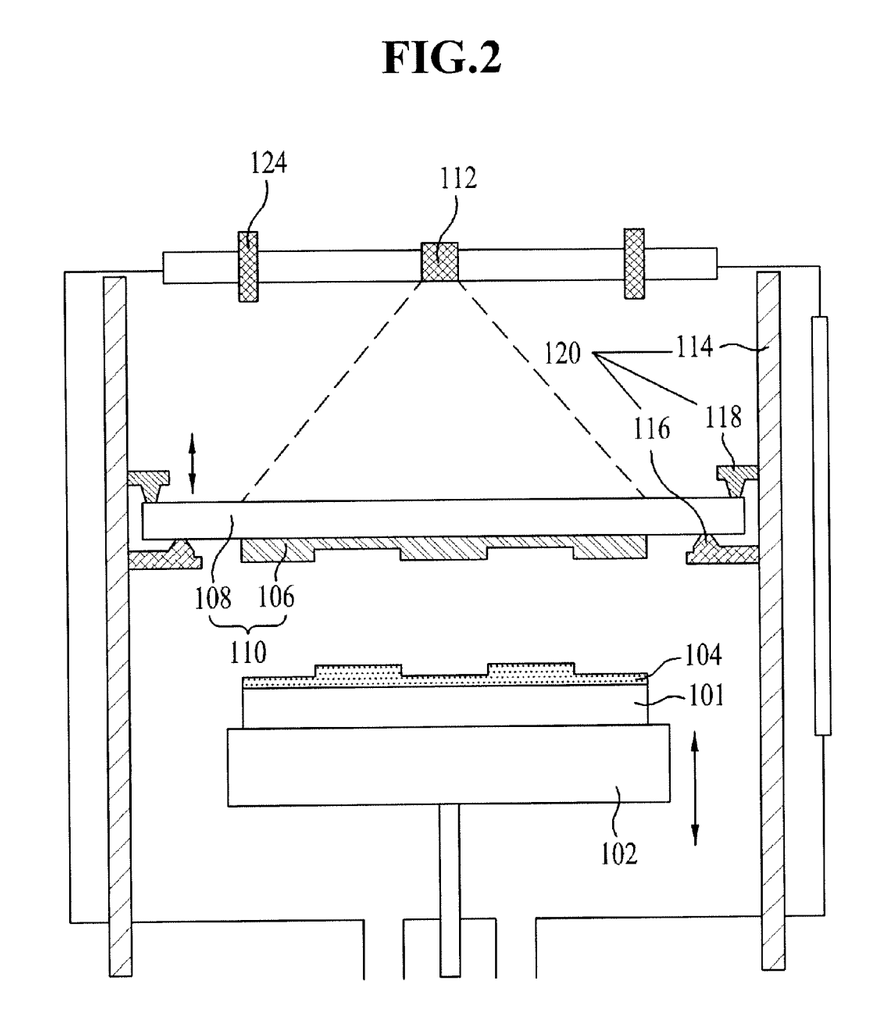
FIG. 2 is a sectional view illustrating a fabricating apparatus of a flat plate display according to the present invention.

FIG. 2 is a sectional view illustrating a fabricating apparatus of a flat plate display according to the present invention.

The fabricating apparatus for imprinting includes a substrate 101, an imprinting mold 110, a light source part 112, a vision part 124 and a mold-for-imprinting support part 120.

The substrate is vacuum-absorbed to a stage 102 and it is seated on the stage 102. On such the substrate 101 may be formed a thin film pattern 104 configured of liquid polymeric precursor patterned by pressing-contact with the imprinting mold 110. The thin film pattern 104 has a predetermined shape reverse-transferred from grooves and projections of the imprinting mold 110.

Figure 3:
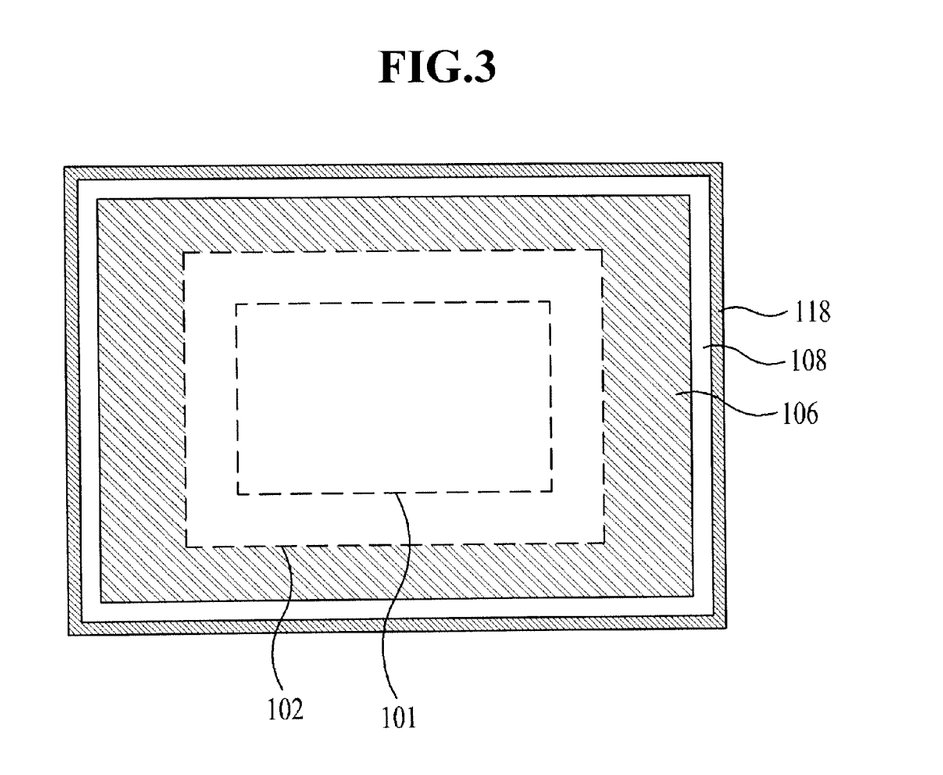
FIG. 3 is a plane view illustrating the fabricating apparatus shown in FIG. 2.

The imprinting mold 110 includes a back plane 108 and a mold part 106 formed on the back plane 108. The size of the back plane 108 may be formed larger than the size of the substrate 101 as shown in FIG. 3. The size of the mold part 106 may be formed similar to the size of the substrate and it includes grooves and projections to form the thin film pattern 104.

The light source part 112 emits lights such as ultraviolet rays or infrared rays to the imprinting mold 110 to harden the thin film pattern 104 formed on the substrate 101.

The vision part 124 identifies a location difference between the imprinting mold 110 and the substrate 101 and it compensate the difference.

Figure 4:
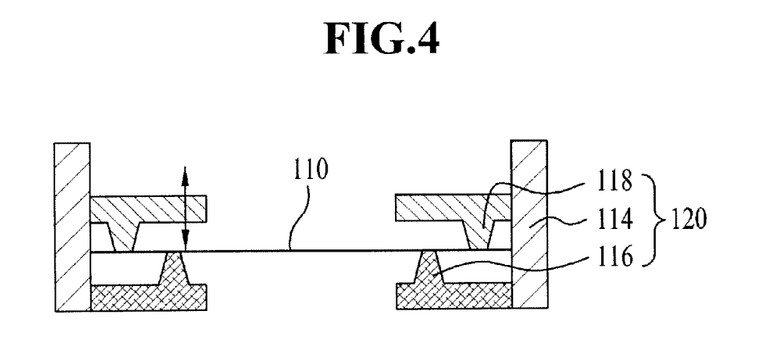
FIG. 4 is a sectional view illustrating a mold supporting part shown in FIG. 2.

The mold-for-imprinting support part 120 includes a supporting frame 114, a supporter 116 and a horizontal compensating part 118 as shown in FIG. 4.

The supporting frame 114 supports the supporter 116 and the horizontal compensating part 118 and it forms a vertical motion passage of the horizontal compensating part 118.

The supporter 116 is formed to allow an edge of a back surface of the back plane 108 of the imprinting mold 110 seated thereon. That is, the supporter 116 contacts with the edge of the back surface of the imprinting mold 110. As a result, the supporter 116 may not affect the moving passage of the ultraviolet rays or infrared rays when the liquid polymeric precursor is hardened by using the light source part 112.

The horizontal compensating part 118 contacts with an edge of a top surface of the back plane 108 of the imprinting mold 110 which is not overlapped with the substrate as shown in FIG. 2. Also, the horizontal compensating part 118 is formed of hard heavy material, for example, Stainless steel, Al, and the like and the area of the horizontal compensating part 118 may be minimized as possible accordingly. Because of that, the horizontal compensating part 118 may not affect the moving passage of the ultraviolet rays and infrared rays when the light source part 112 hardens the liquid polymeric precursor.

When the imprinting mold 110 is bonded with the substrate 101, the horizontal compensating part 118 may move upward along the vertical moving passage of the supporting frame 114 and it may not contact with the top surface of the imprinting mold 110 accordingly. As a result, the pressure applied by the load of the horizontal compensating part 118 may not be applied to the liquid polymeric precursor formed on the substrate 101 when the imprinting mold 110 is bonded with the substrate 101.

Also, the horizontal compensating parts 118 may be arranged alternatively with respect to the supporters 116. For example, the horizontal compensating part 118 may be formed more distant from the mold part 106 of the imprinting mold 110 than the support 116.

Such the horizontal compensating part 118 compensates the load of the back plane 108 to prevent the imprinting mold 110 from moving downward because of the load of the back plane 108 seated on the supporters 116. that is, the horizontal compensating parts 118 applies a predetermined pressure to an outer edge of the top surface of the back plane 108 in a predetermined direction parallel to the downward moving direction of the back plane 108.

Figure 5:
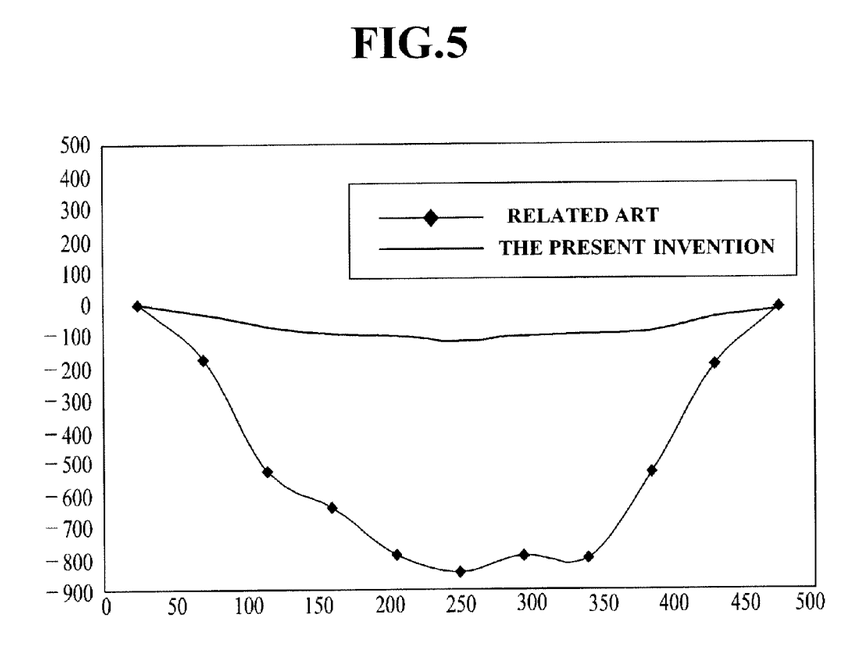
FIG. 5 is a diagram illustrating a degree of bending-down of an imprinting mold according to the present invention.

FIG. 5 is a diagram illustrating the degree of the bending-down of the imprinting mold according to the present invention As shown in FIG. 5, the related art imprinting mold will bend toward the substrate along a direction to a center from an outer portion thereof. Especially, the maximum distance of the bending-down of the related art imprinting mold is approximately 847 μm toward the substrate as shown in FIG. 5 and Table 1.

In contrast, the imprinting mold 110 according to the present invention may have the minimum bending-down because of the horizontal compensating part 118. especially, the downward-bending of the imprinting mold 110 according to the present invention may be reduced approximately by 120 μm less than the downward-bending of the related art imprinting mold, as shown in Table 1.

TABLE 1

| Location of imprinting mold | Related art (μm) | Present invention (μm) |
|---|---|---|
| 25 | 1 | 0 |
| 70 | −175 | −32 |
| 115 | −528 | −71 |
| 160 | −641 | −94 |
| 205 | −789 | −102 |
| 250 | −847 | −120 |
| 295 | −796 | −105 |
| 340 | −800 | −98 |
| 385 | −530 | −87 |
| 430 | −194 | −45 |
| 475 | −15 | −20 |

As mentioned above, the fabricating apparatus of the flat plate display according to the present invention may reduce the downward-bending of the imprinting mold 110 generated by the load of the back plane 108 by using the horizontal compensating part 118 capable of compensating the load of the imprinting mold 110. In addition, the fabricating apparatus according to the present invention may fix the imprinting mold 110 without the downward-bending, when the imprinting mold 110 and the substrate 101 are separated from each other. As a result, damage to the imprinting mold 110 and the thin film pattern may be prevented.

Figure 6A:
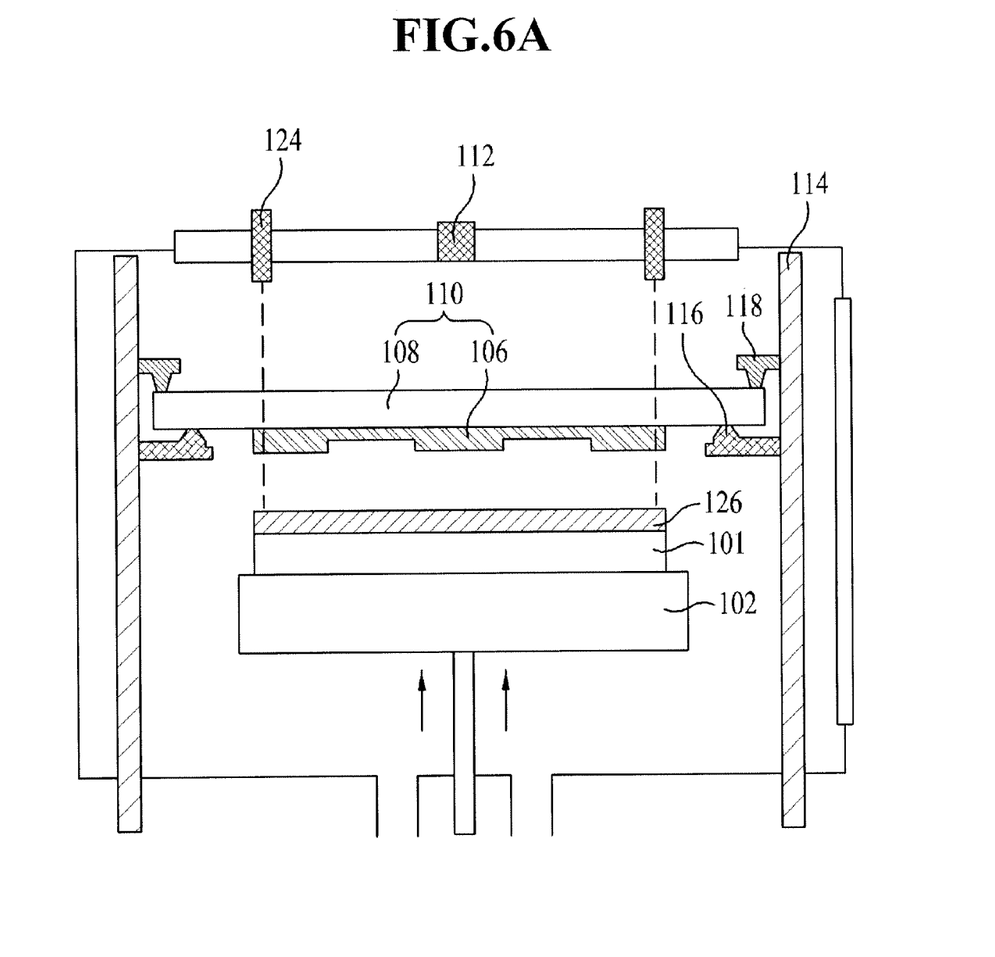
FIGS. 6A to 6C are sectional views illustrating a fabricating method of a flat plate display using the fabricating apparatus shown in FIG. 2.
Figure 6B:
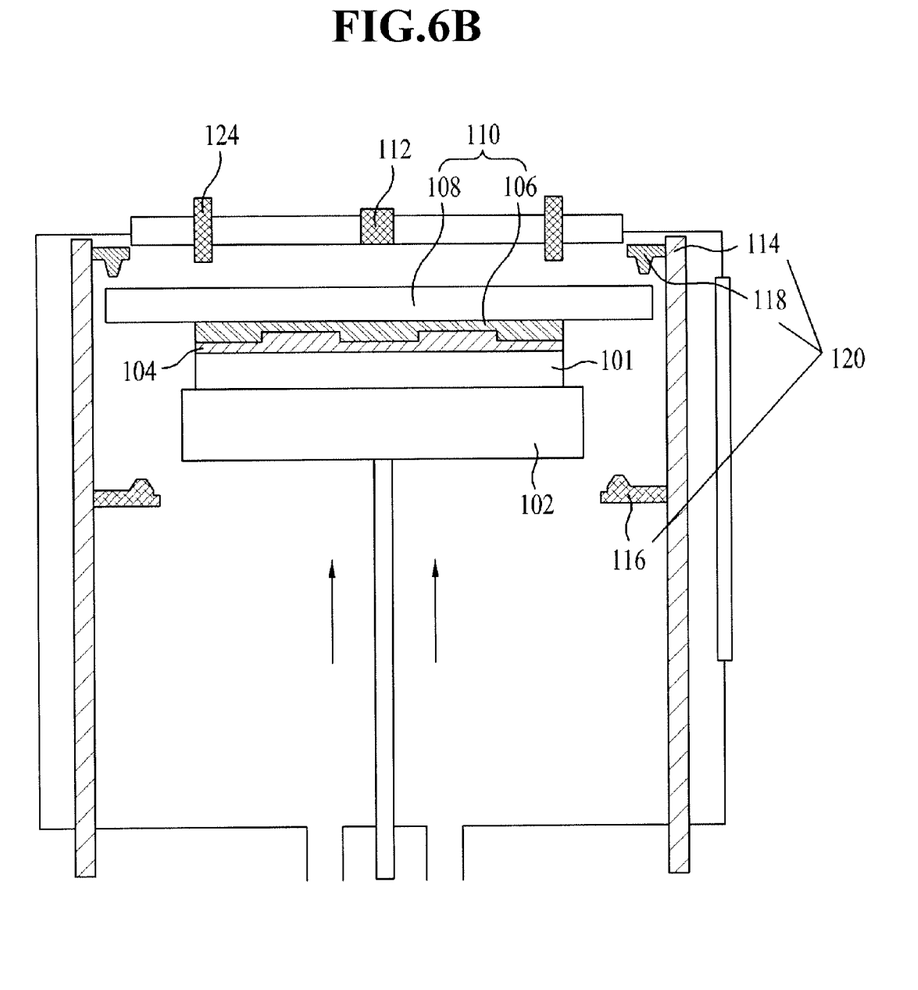
Figure 6C:
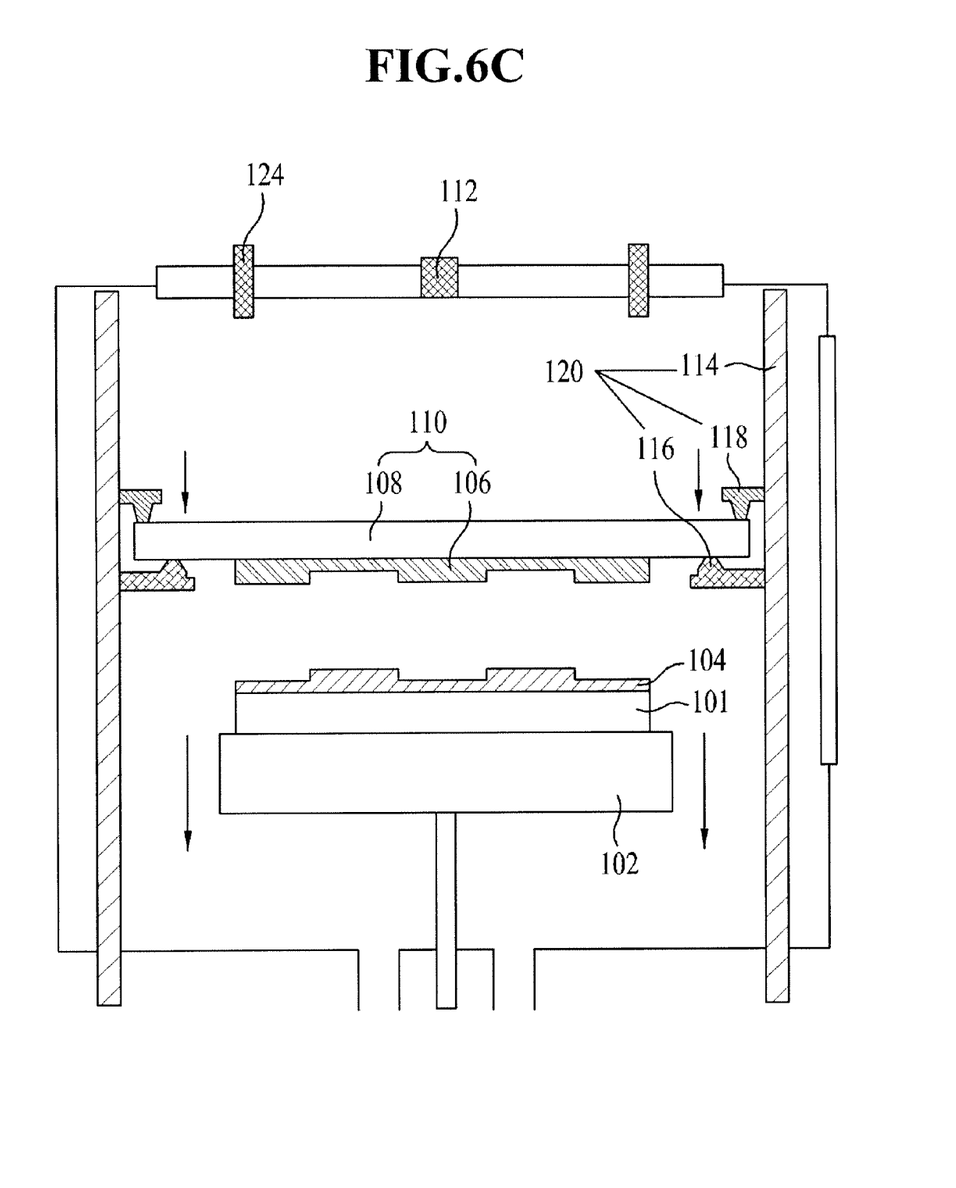

FIGS. 6A to 6C are sectional views illustrating a fabricating method of a flat plate display which uses the fabricating apparatus shown in FIG. 2.

First of all, the liquid polymeric precursor 126 is coated, for example, spin-coated, spinless-coated and the like on the substrate 101. The substrate 101 having the liquid polymeric precursor 126 is seated on the stage 102 as shown in FIG. 6A. The stage 102 having the substrate 101 seated thereon moves upward by the maximum height not in contact with the imprinting mold 110. After that, the imprinting mold 110 and the substrate 101 are aligned to for align-keys (not shown) formed in both the imprinting mold 110 and the substrate 101 via the vision part 124 to correspond with each other.

The stage 102 having the substrate aligned to the imprinting mold thereon may move upward higher than the height of the supporter 116 as shown in FIG. 6B. At the same time, the horizontal compensating part 118 may move upward toward the vision part 124 along the passage of the supporting frame 114 to make the imprinting mold 110 not contact with the horizontal compensating part 118.

Here, when the stage 102 moves upward higher than the height of the supporter 116, the imprinting mold 110 is bonded with the substrate 101. After that, solvent in the liquid polymeric precursor is absorbed to a surface of the imprinting mold 110 to move the liquid polymeric precursor into the grooves of the imprinting mold 110 and the liquid polymeric precursor is hardened by the light source part 112 to form the thin pattern 104 on the substrate 101. The thin film pattern 104 has a shape reverse-transferred from the grooves of the imprinting mold 110.

Hence, as shown in FIG. 6C, the stage 102 on which the substrate 101 having the thin film pattern 104 formed therein is seated may move downward and the horizontal compensating part 118 may move downward toward the imprinting mold 110 simultaneously. As a result, the imprinting mold 110 is horizontally fixed by the horizontal compensating parts 118 and the supporters 116 and the substrate 101 having the thin film pattern 104 formed thereon is separated from the imprinting mold 110.

Figure 7:
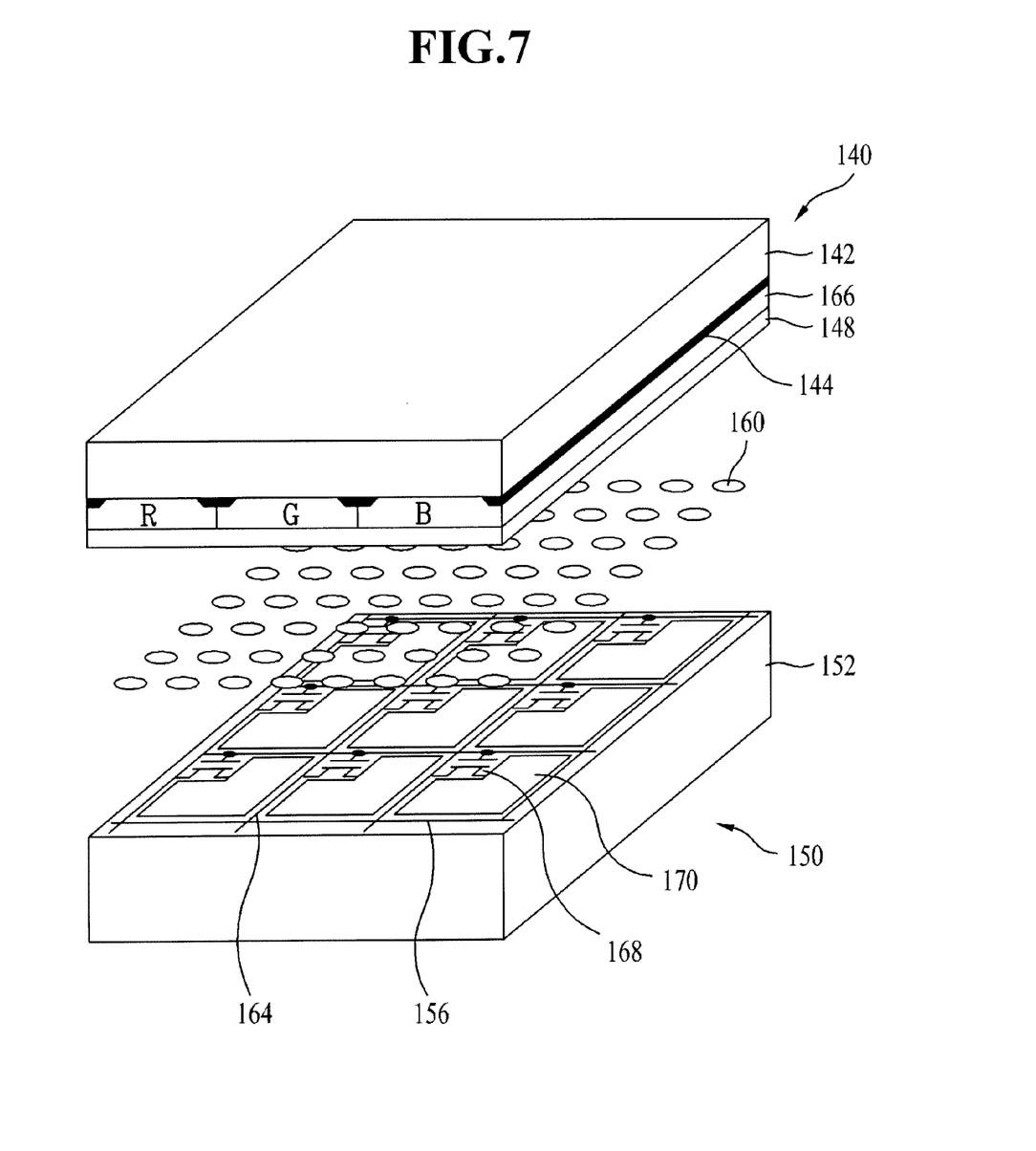
FIG. 7 is a perspective view illustrating a liquid crystal display panel having a thin film pattern formed by the fabricating method shown in FIGS. 6A to 6C.

The thin film pattern 104 formed by using the imprinting mold 110 is applicable to a liquid crystal display panel shown in FIG. 7. specifically, the liquid crystal display panel according to the present invention shown in FIG. 7 includes a thin film transistor substrates 150 and a color filter substrate 140 which are bonded in opposite, with a liquid crystal layer 160 formed there between.

The color filter substrate 140 includes a black matrix 144 formed on an upper substrate 142 to prevent light escape, a color filter 166 configured to represent colors, a common electrode 148 configured to form a pixel electrode and an electric field, a cover-coat layer configured for planarization, a column spacer formed on the over-coat layer to maintain a cell gap and an upper alignment layer (not shown) configured to cover the other components.

The thin film transistor substrate 150 includes gate lines 156 and data lines 164 which are formed on a lower substrate 152 with crossing each other, thin film transistors 168 located adjacent to cross points of the gate and data lines, pixel electrodes 170 formed in pixel regions formed by the crossover structure, and a lower alignment layer (not shown) configured to cover the other components.

Such the color filter 166, black matrix 154, column spacer, thin film transistors 168, gate lines 156 and data lines 164 and pixel electrode 170 may be formed by the patterning process using the above imprinting mold including the grooves corresponding to patterns thereof.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A fabricating method of a flat plate display comprising steps of:
    seating a substrate having liquid polymeric precursor formed thereon on a stage;
    bonding an imprinting mold and the substrate with each other by moving the stage upward, for grooves and projections of the imprinting mold to press the liquid polymeric precursor, wherein a horizontal compensating part is not in contact with the imprinting mold when the imprinting mold and the substrate are bonded with each other; and
    separating the imprinting mold and the substrate from each other by allowing a supporter to support the imprinting mold and allowing the horizontal compensating part to press the imprinting mold in an opposite direction with respect to the supporter simultaneously with moving the stage downward.

2. The fabricating method of claim 1, wherein the size of the imprinting mold is larger than the size of the substrate, and the supporter and the horizontal compensating part are installed in an edge of the imprinting mold which is not overlapped with the substrate.

3. The fabricating method of claim 1, wherein the horizontal compensating part is in contact with the imprinting mold when the imprinting mold and the substrate are separated from each other.

4. The fabricating method of claim 3, wherein the horizontal compensating part moves in opposite direction with respect to the imprinting mold along a moving passage of a supporting frame configured to support the horizontal compensating part when the imprinting mold and the substrate are bonded with each other, and the horizontal compensating part moves in direction with respect to the imprinting mold along the moving passage of the supporting frame when the imprinting mold and the substrate are separated from each other.

5. The fabricating method of claim 1, wherein the horizontal compensating part is formed of Stainless steel or Aluminum based material.

* * * * *